United States Patent
Iriyama (10) Patent No.: US 12,327,038 B2
(45) Date of Patent: Jun. 10, 2025

(54) SOUND PROCESSING METHOD

(71) Applicant: Yamaha Corporation, Shizuoka (JP)

(72) Inventor: Tatsuya Iriyama, Shizuoka (JP)

(73) Assignee: Yamaha Corporation, Shizuoka (JP)

( * ) Notice: Subject to any disclaimer, the term of this patent is extended or adjusted under 35 U.S.C. 154(b) by 201 days.

(21) Appl. No.: 17/950,737

(22) Filed: Sep. 22, 2022

(65) Prior Publication Data

US 2023/0019428 A1    Jan. 19, 2023

Related U.S. Application Data (63) Continuation of application No. PCT/JP2020/045808, filed on Dec. 9, 2020.

(30) Foreign Application Priority Data

Mar. 23, 2020  (JP) .................................. 2020-050818

(51) Int. Cl.
G06F 3/06    (2006.01)

(52) U.S. Cl.
CPC .......... *G06F 3/0655* (2013.01); *G06F 3/0604* (2013.01); *G06F 3/0673* (2013.01)

(58) Field of Classification Search
CPC .... G06F 3/0655; G06F 3/0604; G06F 3/0673; G06F 1/1684; G06F 3/03547; G06F 3/0611; G06F 3/0656; H03K 2217/9651; H03K 17/941; H03K 17/962; G10H 1/00
See application file for complete search history.

(56) References Cited

U.S. PATENT DOCUMENTS

| | | | | |
|---|---|---|---|---|
| 2012/0304199 A1* | 11/2012 | Homma | ................ | G06F 3/0488 |
| | | | | 719/318 |
| 2014/0223490 A1* | 8/2014 | Pan | .................... | H04N 21/8186 |
| | | | | 345/173 |
| 2020/0356194 A1* | 11/2020 | Kamepalli | .......... | G06F 3/03547 |
| 2021/0252383 A1* | 8/2021 | VanWyk | .................. | H04R 5/00 |
| 2022/0101719 A1* | 3/2022 | Bojic | ...................... | H04L 67/51 |
| 2023/0146023 A1* | 5/2023 | Julen | ..................... | G06F 3/0425 |
| | | | | 345/156 |

FOREIGN PATENT DOCUMENTS

| | | |
|---|---|---|
| JP | S54-014901 B | 6/1979 |
| JP | 2009109465 A | 5/2009 |
| JP | 2011118006 A | 6/2011 |
| JP | 2015075805 A | 4/2015 |

OTHER PUBLICATIONS

Notice of Reasons for Refusal in the corresponding Japanese Patent Application No. 2020-050818, dated Feb. 2, 2024.

* cited by examiner

*Primary Examiner* — Jason W Blust
(74) *Attorney, Agent, or Firm* — Global IP Counselors, LLP (57) ABSTRACT

An information processing method, which is executed by a computer, includes detecting a first state in which an object is separated from an operation surface by a prescribed distance, detecting a second state in which the object comes in contact with the operation surface after the first state is detected, executing a first process which includes reading data from a first storage device and loading, into a second storage device, the data that are read, in response to the detecting of the first state, and executing a second process with respect to the data loaded into the second storage device, in response to the detecting of the second state.

12 Claims, 6 Drawing Sheets

SOUND PROCESSING METHOD

CROSS-REFERENCE TO RELATED APPLICATIONS

This application is a continuation application of International Application No. PCT/JP2020/045808, filed on Dec. 9, 2020, which claims priority to Japanese Patent Application No. 2020-050818 filed in Japan on Mar. 23, 2020. The entire disclosures of International Application No. PCT/JP2020/045808 and Japanese Patent Application No. 2020-050818 are hereby incorporated herein by reference.

BACKGROUND

Technological Field

The present disclosure relates to technology for loading data into a storage device.

Background Information

A configuration in which data stored in a storage device are temporarily stored in cache memory to realize high-speed access to the data has been widely used in the prior art (for example, refer to Japanese Patent No. 981960).

SUMMARY

However, in the conventional configuration, the data are loaded after a user has issued an instruction to use the data, for example, making it difficult to sufficiently reduce the delay between the user's instruction and the actual processing of the data. Given these circumstances, an object of one aspect of the present disclosure is to promptly start processing of data stored in a storage device.

An information processing method according to one aspect of the present disclosure is executed by a computer and comprises detecting a first state in which an object is separated from an operation surface by a prescribed distance, detecting a second state in which the object comes in contact with the operation surface after the first state is detected, executing a first process which includes reading data from a first storage device and loading, into a second storage device, the data that are read, in response to the detecting of the first state, and executing a second process with respect to the data loaded into the second storage device, in response to detecting of the second state.

An information processing system according to one aspect of the present disclosure comprises an electronic controller including at least one processor. The electronic controller is configured to execute a plurality of modules including a state detection module configured to detect a first state in which an object is separated from an operation surface by a prescribed distance, and detect a second state in which the object comes in contact with the operation surface after the first state is detected, a first processing module configured to execute a first process which includes reading data from a first storage device and load, into a second storage device, the data that are read, in response to the state detection module detecting the first state, and a second processing module configured to execute a second process with respect to the data loaded into the second storage device in response to the state detection module detecting the second state.

A non-transitory computer readable medium storing a program according to one aspect of the present disclosure causes a computer to execute a process that comprises detecting a first state in which an object is separated from an operation surface by a prescribed distance, detecting a second state in which the object comes in contact with the operation surface after the first state is detected, executing a first process which includes reading data from a first storage device and loading, into a second storage device, the data that are read, in response to the detecting of the first state, and executing a second process with respect to the data loaded into the second storage device, in response to the detecting of the second state.

DETAILED DESCRIPTION OF THE EMBODIMENTS

Selected embodiments will now be explained in detail below, with reference to the drawings as appropriate. It will be apparent to those skilled from this disclosure that the following descriptions of the embodiments are provided for illustration only and not for the purpose of limiting the invention as defined by the appended claims and their equivalents.

A: First Embodiment

Figure 1:
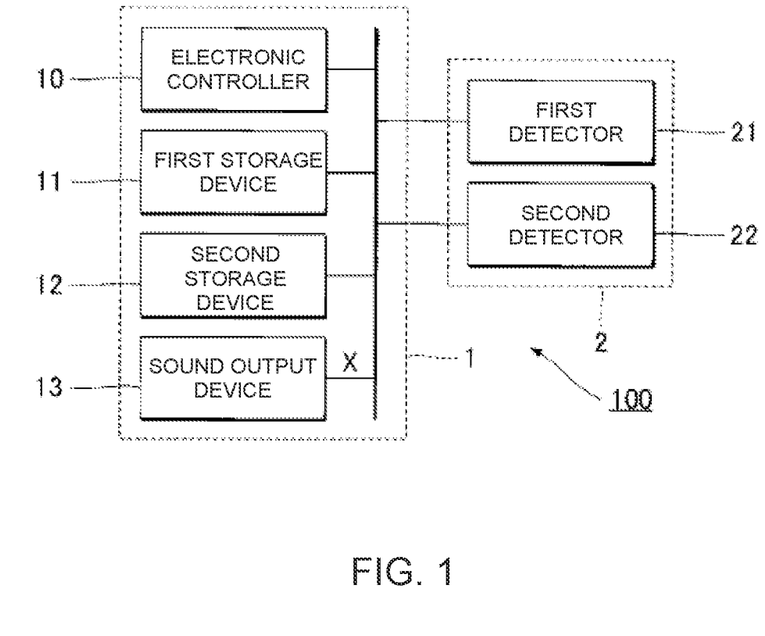
FIG. 1 is a block diagram illustrating the configuration of an information processing system.

FIG. 1 is a block diagram illustrating the configuration of an information processing system 100 according to a first embodiment of the present disclosure. The information processing system 100 is a computer system that executes a process in accordance with an operation by a user. The information processing system 100 has a control system 1 and a detection unit (detector) 2. The detection unit 2 is an input device that detects the user operation. The control system 1 executes a process in accordance with the operation detected by the detection unit 2.

The control system 1 includes an electronic controller (control device) 10, a first storage device 11, a second storage device 12, and a sound output device 13. The control system 1 is realized, for example, by an information terminal such as a smartphone, a tablet terminal, or a personal computer. The control system 1 can be realized as a single device, or as a plurality of separate devices.

The electronic controller 10 is one or a plurality of processors that control each element of the control system 1. Specifically, the electronic controller 10 can be configured to comprise one or more types of processors, such as a CPU (Central Processing Unit), an SPU (Sound Processing Unit), a DSP (Digital Signal Processor), an FPGA (Field Programmable Gate Array), an ASIC (Application Specific Integrated Circuit), and the like. The electronic controller 10 generates an audio signal X in accordance with the user operation. The term "electronic controller" as used herein refers to hardware that executes software programs.

The sound output device 13 emits sound (hereinafter referred to as "target sound") represented by the audio signal X generated by the electronic controller 10. The sound output device 13 is, for example, a speaker or headphones. The D/A converter that converts the audio signal X from digital to analog and the amplifier that amplifies the audio signal X have been omitted from the figure for the sake of convenience. Further, the example shown in FIG. 1 shows a configuration in which the sound output device 13 is provided within the control system 1. In another example, the sound output device 13 can be separated from the control system 1 and connected to the control system 1 wirelessly or by wire.

The first storage device 11 includes one or more storage media (computer memories) for storing a program to be executed by the electronic controller 10 and various data that are used by the electronic controller 10. The first storage device 11 is a storage medium that has a larger storage capacity and slower read speed than the second storage device 12. A storage device, including non-volatile storage media such as a magnetic storage medium or an optical recording medium, is used as the first storage device 11. The first storage device 11 stores, in addition to programs executed by the electronic controller 10, control data C which are used for generating the audio signal X. The control data C are, for example, waveform data in the time domain representing a sound waveform. Specifically, the control data C representing performance sounds of various musical instruments, such as percussion instruments, are stored in the first storage device 11.

The second storage device 12 includes one or more storage media (computer memories) for storing a program that is executed by the electronic controller 10 and various data that are used by the electronic controller 10, in the same manner as the first storage device 11. The second storage device 12 is a storage medium that has a smaller storage capacity and faster read speed than the first storage device 11. A volatile or non-volatile storage device, including storage media such as a semiconductor recording medium, is used as the second storage device 12. For example, a main storage device or cache memory is used as the second storage device 12. The electronic controller 10 executes programs loaded into the second storage device 12 from the first storage device 11 to realize various functions.

Figure 2:
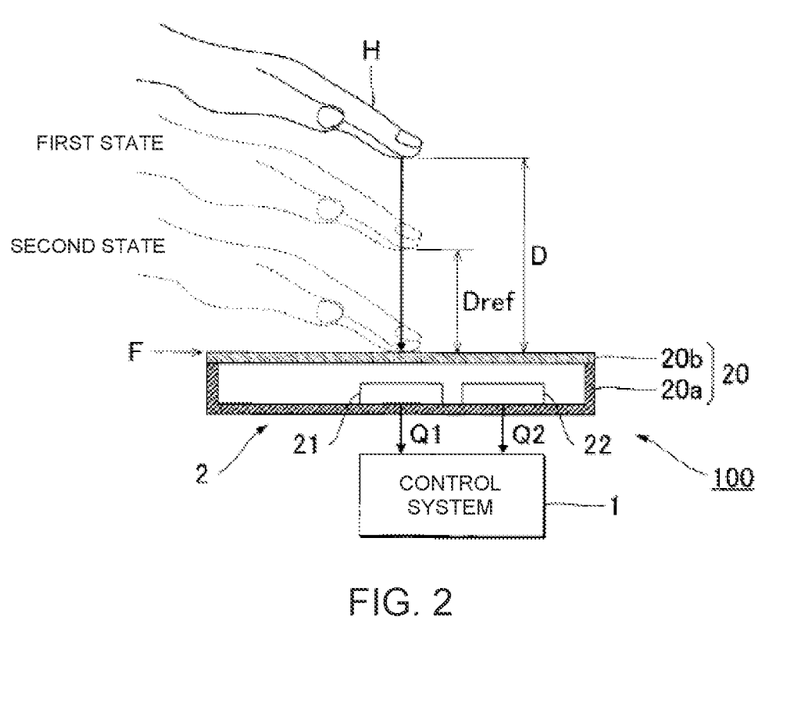
FIG. 2 is a schematic diagram illustrating the configuration of a detection unit.

FIG. 2 is a schematic diagram illustrating the configuration of the detection unit 2. The detection unit 2 has a housing 20, a first detector 21, and a second detector 22. The housing 20 is a hollow structure that houses the first detector 21 and the second detector 22. More specifically, the housing 20 has an enclosure portion 20a and a light transmission portion 20b. The enclosure portion 20a is a box-shaped structure that has an internal space and that is open at the top. The light transmission portion 20b is a plate-shaped member that closes the opening of the housing portion 20a. The light transmission portion 20b transmits light in a wavelength range that can be detected by the first detector 21. The light transmission portion 20b has an operation surface (striking surface) F, which is the surface opposite to the surface facing the enclosure portion 20a. The user can move his or her hand H close to or away from the operation surface F and can strike the operation surface F with his or her hand H. The user's hand H is one example of an "object."

The first detector 21 is an optical sensor that detects the state of the user's hand H. The first detector 21 is installed in the vicinity of the midpoint (center) of the bottom surface of the enclosure portion 20a. Specifically, a distance-measuring sensor that measures the distance between the object and a light-receiving surface is used as the first detector 21. For example, the first detector 21 generates a time-series detection signal Q1 that represents the position of the hand (specifically, the distance from the light-receiving surface to the hand H) in a direction perpendicular to the operation surface F by receiving the light reflected from the hand H that has passed through the light transmission portion 20b. The detection signal Q1 is transmitted to the control system 1 via wired or wireless communication. The light detected by the first detector 21 is not limited to visible light. For example, invisible light, such as infrared light, can be detected by the first detector 21.

The second detector 22 is a sensor for detecting the contact of the hand H with the operation surface F. For example, a sound collection device that collects ambient sound is used as the second detector 22. The second detector 22 collects the striking sounds generated when the user's hand H strikes the operation surface F. The second detector 22 generates a detection signal Q2 that represents ambient sounds which include striking sounds. The detection signal Q2 is transmitted to the control system 1 via wired or wireless communication. The second detector 22 can be installed outside of the housing 20.

Figure 3:
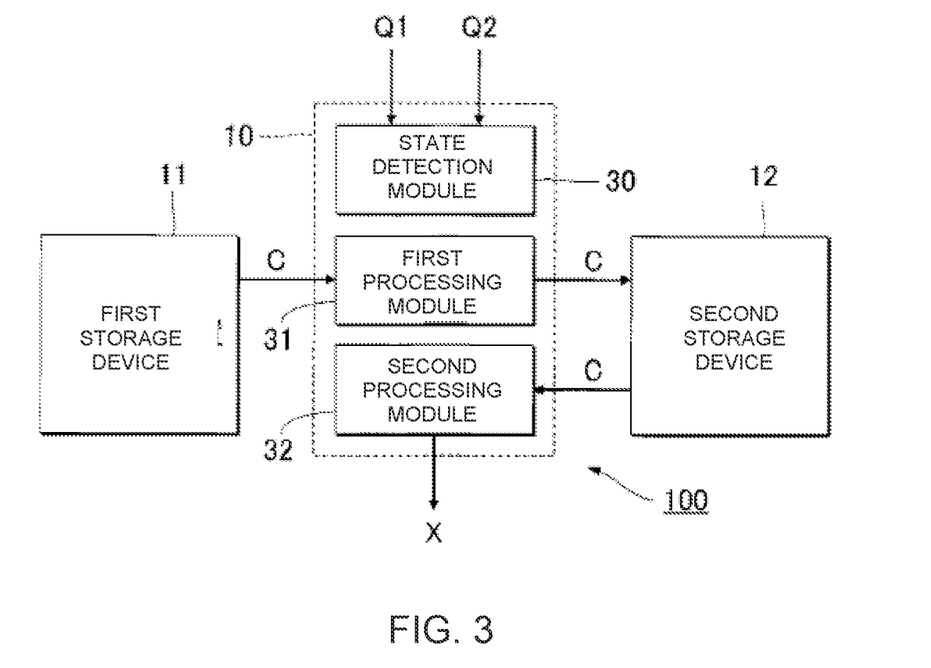
FIG. 3 is a block diagram illustrating the functional configuration of a control system.

FIG. 3 is a block diagram illustrating the functional configuration of the control system 1. The electronic controller 10 of the control system 1 loads programs stored in the storage device 11 into the second storage device 12 and executes the programs to realize a plurality of functions (state detection module (state detection unit) 30, first processing module (first processing unit) 31, and second processing module (second processing unit) 32).

The state detection module 30 detects the state of the user's hand H in accordance with the detection result (detection signal Q1 and detection signal Q2) of the detection unit 2. More specifically, the state detection module 30 detects a first state or a second state as the state of the hand H. As shown in FIG. 2, in the first state, the hand H is separated from the operation surface F by a prescribed distance (hereinafter referred to as "reference value") Dref. In the second state, the hand H is in contact with the operation surface F.

Figure 4:
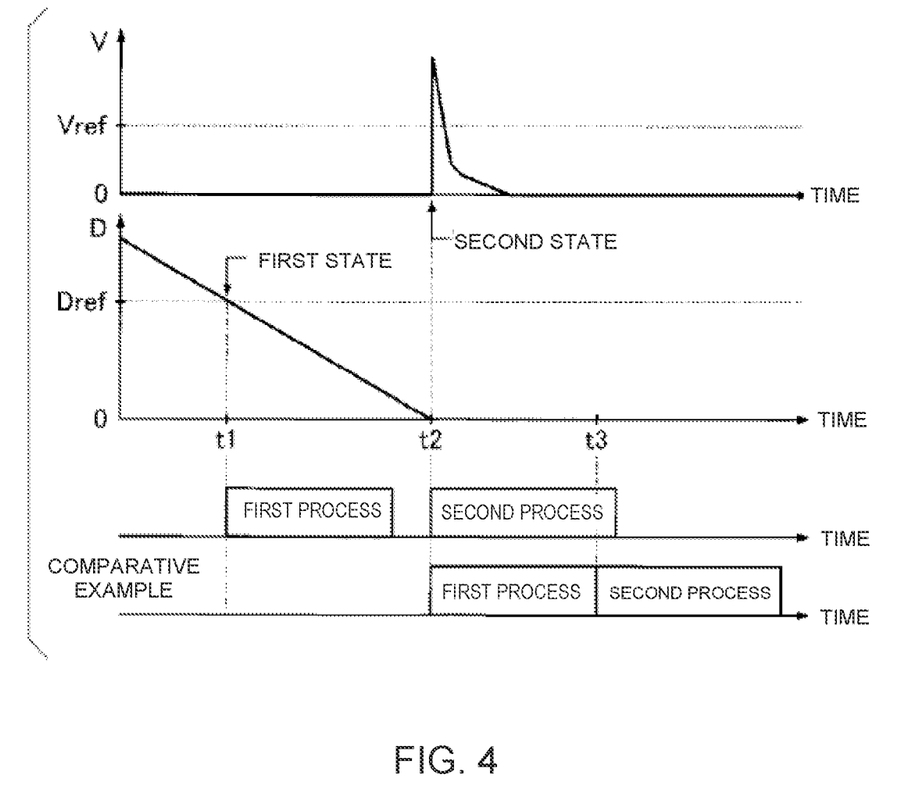
FIG. 4 is an explanatory diagram relating to the state of a user's hand.

FIG. 4 is an explanatory diagram pertaining to the state of the hand H. The state detection module 30 analyzes the detection signal Q1 generated by the first detector 21 and detects that hand H is in the first state. More specifically, the state detection module 30 analyzes the detection signal Q1 and calculates the distance D between the operation surface F and the hand H. The calculation of the distance D is repeated at a prescribed cycle. That is, time-series data are generated that represent the distance D. Any known technology can be used to calculate the distance D. FIG. 4 illustrates temporal changes in the distance D. The state detection module 30 determines that the hand H is in the first state when the distance D between the operation surface F and the hand H matches the reference value Dref. The state detection module 30 can also determine that the hand H is in the first state when the distance D is included in a prescribed allowable range that includes the reference value Dref. The reference value Dref is a preset fixed value. However, the reference value Dref can be changed in accordance with an instruction from the user.

The state detection module 30 also detects that the hand H is in the second state by analyzing the detection signal Q2 generated by the second detector 22. More specifically, the state detection module 30 calculates a volume V of the sound represented by the detection signal Q2. The calculation of volume V is repeated at a prescribed cycle. That is, time-series data are generated that represent the volume V. Any known technology can be used to calculate the volume V. FIG. 4 illustrates temporal changes in volume V. When a striking sound is generated when the operation surface F is struck, there is an abrupt increase in the volume V. When the volume V exceeds a prescribed value (hereinafter referred to as "reference value") Vref (that is, when the striking sound is collected), the state detection module 30 determines that the hand H is in the second state. The reference value Vref is a preset fixed value. However, the reference value Vref can be changed in accordance with an instruction from the user.

The user's hand H sequentially enters the first state and the second state in a series of processes of approaching the operation surface F. More specifically, the hand H is in the first state at a time point t1 during the process of the hand H approaching the operation surface F, and the hand H is in the second state at a time point t2 which is subsequent to time point t1. That is, the hand H enters the first state before the second state. The time point t1 and time point t2 are separated by an interval on the time axis.

If the state detection module 30 detects that the hand H is in the first state, the first processing module 31 of FIG. 3 executes a first process for loading the control data C stored in the first storage device 11 into the second storage device 12. That is, the first process is executed at the time point t1 when the distance D reaches the reference value Dref in the process of the hand H approaching the operation surface F. The first process includes a process for reading the control data C from the first storage device 11 and loading the control data C into the second storage device 12.

If the state detection module 30 detects that the hand H is in the second state, the second processing module 32 executes a second process with respect to control data C loaded into the second storage device 12. That is, the second process is executed at time point t2 when volume V reaches a reference value Vref, subsequent to the first state in the process of hand H approaching operation surface F.

The second process is an acoustic process that generates acoustic signal X using the control data C loaded into the second storage device 12. More specifically, the second process adjusts the pitch of sounds represented by the control data C in accordance with the volume V of the detection signal Q2 to generate the audio signal X. Therefore, the audio signal X is generated that represents the target sound of the pitch that corresponds to the intensity with which the hand H strikes the operation surface F. For example, the greater the intensity with which the operation surface F is struck is, the higher the pitch of the audio signal X is generated. The contents of the second process are not limited to the example described above. For example, the second processing module 32 can execute, as the second process, an effect imparting process for imparting an acoustic effect, such as a reverberation effect, to the control data C, or a filtering process for changing the frequency response of the sound represented by the control data C. The target sound is generated by supplying the audio signal X, which is generated by the second processing module 32 by the second process described above, to the sound output device 13. As can be understood from the foregoing explanation, the second process includes a process for generating sound in accordance with the control data C loaded into the second storage device 12.

Figure 5:
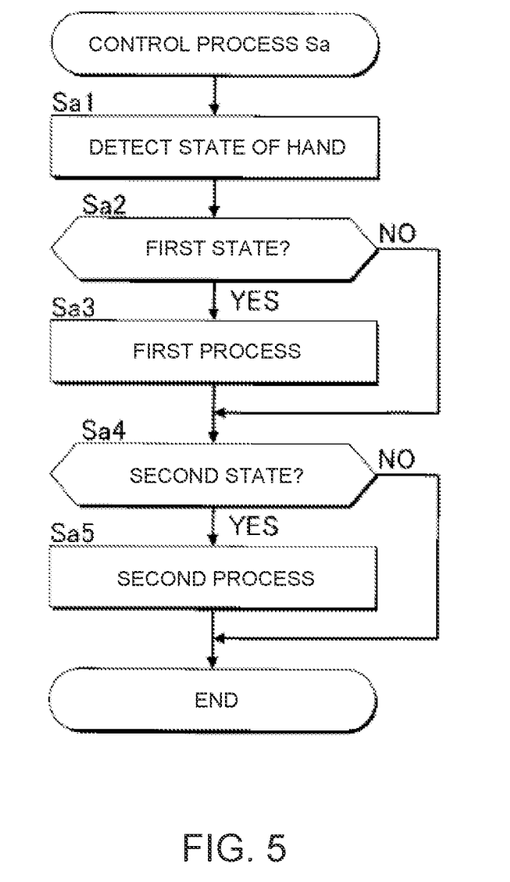
FIG. 5 is a flowchart illustrating the specific procedure of a control process.

FIG. 5 is a flowchart illustrating the specific procedure of a process (hereinafter referred to as "control process") Sa executed by the electronic controller 10. For example, the control process Sa is repeated at a cycle that is sufficiently shorter than the cycle in which the user's hand H approaches and separates from the operation surface F.

When the control process Sa is initiated, the electronic controller 10 (state detection module 30) analyzes the detection signal Q1 and the detection signal Q2 supplied from the detection unit 2 to detect the state of the user's hand H (Sa1). The electronic controller 10 (first processing module 31) determines whether the state detection module 30 has detected that the hand H is in the first state (Sa2). If the hand H is in the first state (Sa2: YES), the electronic controller 10 (first processing module 31) executes the first process for loading the control data C stored in the first storage device 11 into the second storage device 12 (Sa3). On the other hand, if the hand H is not in the first state (Sa2: NO), the first process is not executed.

If the hand H is not in the first state (Sa2: NO), or if the first process is executed, the electronic controller 10 (second processing module 32) determines whether the state detection module 30 has detected that the hand H is in the second state (Sa4). If the hand H is in the second state (Sa4: YES), the electronic controller 10 (second processing module 32) executes the second process with respect to the control data C loaded in the second storage device 12 (Sa5). The target sound is generated by supplying the audio signal X, which is generated by the second process, to the sound output device 13. On the other hand, if the hand H is not in the second state (Sa4: NO), the second process is not executed.

FIG. 4 shows, in a comparative example, a configuration in which the first process is started at the time point t2 when the hand H strikes the operation surface F. In the comparative example, the second process is started at a the time point t3, after the end of the first process, which started at the time point t2. Therefore, the target sound represented by the audio signal X is output from the sound output device 13 at a time point that is delayed with respect to the user's contact with the operation surface F. In contrast to the comparative example, in the first embodiment, if the hand H is detected to be in the first state, the control data C are loaded into the second storage device 12. That is, the control data C are prepared in the second storage device 12 before the hand H comes in contact with the operation surface F. Therefore, the second process can be started more quickly than in the comparative example. More specifically, the second process can be started from the time point t2 when the user contacts the operation surface F. Therefore, compared with the comparative example, the delay from the time when the user hand H comes in contact with the operation surface F to the time when the target sound is generated is reduced.

Further, in the first embodiment, the first process and the second process are executed sequentially in a series of processes from the time when the user's hand H approaches operation surface F until the time of contact therewith. Therefore, there is the advantage that the first process is executed without the user being particularly cognizant that his or her hand H is in the first state. That is, the user need only make contact with the operation surface F at the time that the target sound is to be generated, and the user is not required to consciously instruct the first process before producing the target sound.

B: Second Embodiment

The second embodiment will be described below. In each of the following embodiments, elements that have functions that are similar to corresponding elements in the first embodiment have been assigned the same reference numerals that were used in the description in the first embodiment and their detailed descriptions have been appropriately omitted.

The information processing system 100 according to the second embodiment generates a target sound having an acoustic characteristic corresponding to a position where the hand H comes in contact with the operation surface F (hereinafter referred to as "striking position"). The first storage device 11 stores M (N0) (where M is an integer greater than or equal to 2) pieces of the control data C, respectively corresponding to a plurality of different striking positions. The acoustic characteristic (for example, tone) of the sound represented by each piece of the control data C is different for each piece of the control data C.

If the hand H is detected to be in the first state, the first processing module 31 of the first embodiment reads one piece of the control data C from the first storage device 11 and loads it into the second storage device 12. If the hand H is detected to be in the first state, the first processing module 31 of the second embodiment reads N pieces (where N is an integer greater than or equal to 2 and less than or equal to M) of the control data C out of the M pieces of the control data C stored in the first storage device 11 and loads them into the second storage device 12.

Specifically, the first processing module 31 identifies the position of the hand H (hereinafter referred to as "temporary position") at the time point t1 when the hand H is detected to be in the first state. The temporary position is the position of hand H on a plane parallel to the operation surface F and corresponds to the temporary striking position until the hand H actually comes in contact with the operation surface F. The actual striking position, although not precisely coincident with the temporary position, is expected to be close to the temporary position. The first processing module 31 loads into the second storage device 12 N pieces of the control data C, which correspond to striking positions close to the temporary position, from among the M pieces of the control data C stored in the first storage device 11. That is, the control data C that correspond to the striking position predicted by the temporary position of the hand H in the first state are loaded into the second storage device 12. Therefore, of the M pieces of the control data C stored in the first storage device 11, the combination of the N pieces of the control data C loaded into the second storage device 12 changes in accordance with the temporary position at the time point t1. In other words, the N pieces of the control data C are candidates of the control data C for which the second process should be executed. The N pieces of the control data C are an example of the "plurality of pieces of data."

When the user's hand H is in the second state, the striking position with respect to the operation surface F becomes fixed. The second processing module 32 executes the second process with respect to one piece of the control data C corresponding to the actual striking position, from among the N pieces of the control data C loaded into the second storage device 12. For example, one piece of the control data C corresponding to the striking position closest to the position of the hand H on the operation surface F at the time point t2 (that is, the actual striking position with respect to the operation surface) is selected from the N pieces of the control data C stored in storage device 12 as the target of the second process. The contents of the second process are the same as in the first embodiment. That is, the sound output device 13 emits a target sound having the acoustic characteristic corresponding to the striking position. As can be understood from the foregoing explanation, the second process in the second embodiment is a process for generating a sound in accordance with any one of the N pieces of data loaded into the second storage device 12.

The same effects as those of the first embodiment are realized in the second embodiment. In a configuration in which N (i.e., plural) pieces of the control data C are loaded into the second storage device 12, more time is required for the first process than in the first embodiment in which one piece of the control data C is loaded into the second storage device 12. Therefore, in the comparative example in which the first process is initiated at the time point t2 when the hand H strikes the operation surface F, if a plurality of pieces of the control data C are loaded into the second storage device 12, the delay in the generation of the target sound becomes particularly pronounced. In consideration of the circumstances described above, a configuration in which the first process is executed at the time point t1 when the first state is detected for the purpose of reducing the delay of the target sound is exceptionally effective in a configuration in which a plurality of pieces of the control data C are loaded into the second storage device 12, as in the second embodiment.

In the second embodiment, a case in which N pieces of the control data C corresponding to the temporary position from among the M pieces of the control data C corresponding to different striking positions are loaded into the second storage device 12 is used as an example, but the conditions for selecting the N pieces of the control data C are not limited by the example described above.

For example, it is possible to conceive of a first aspect for generating a target sound having an acoustic characteristic corresponding to the direction in which the user's hand H moves with respect to the operation surface F (hereinafter referred to as "direction of movement"). The direction of movement is the angle of the movement of the hand H with respect to the operation surface F (or a line perpendicular to the operation surface F). In the first aspect, M pieces of the control data C respectively corresponding to a plurality of different directions of movement are stored in the first storage device 11. The first processing module 31 loads into the second storage device 12 N pieces of the control data C, which correspond to temporary directions of movement at the time point t1, from among the M pieces of the control data C stored in the first storage device 11. The second processing module 32 executes the second process with respect to one piece of the control data C, which corresponds to the definitive movement direction at the time point t2, from among the N pieces of the control data C loaded into the second storage device 12.

Further, it is possible to conceive of a second aspect for generating a target sound having an acoustic characteristic corresponding to the speed with which the user's hand H moves with respect to the operation surface F (hereinafter referred to as "movement speed"). In the second aspect, M pieces of the control data C corresponding to a plurality of different movement speeds are stored in the first storage device 11. The first processing module 31 loads into the second storage device 12 N pieces of the control data C, which correspond to temporary movement speeds at the time point t1, from among the M pieces of the control data C stored in first storage device 11. The second processing module 32 executes the second process with respect to one piece of the control data C, which correspond to the definitive movement speed at the time point t2, from among the N pieces of the control data C loaded into the second storage device 12.

C: Third Embodiment

Figure 6:
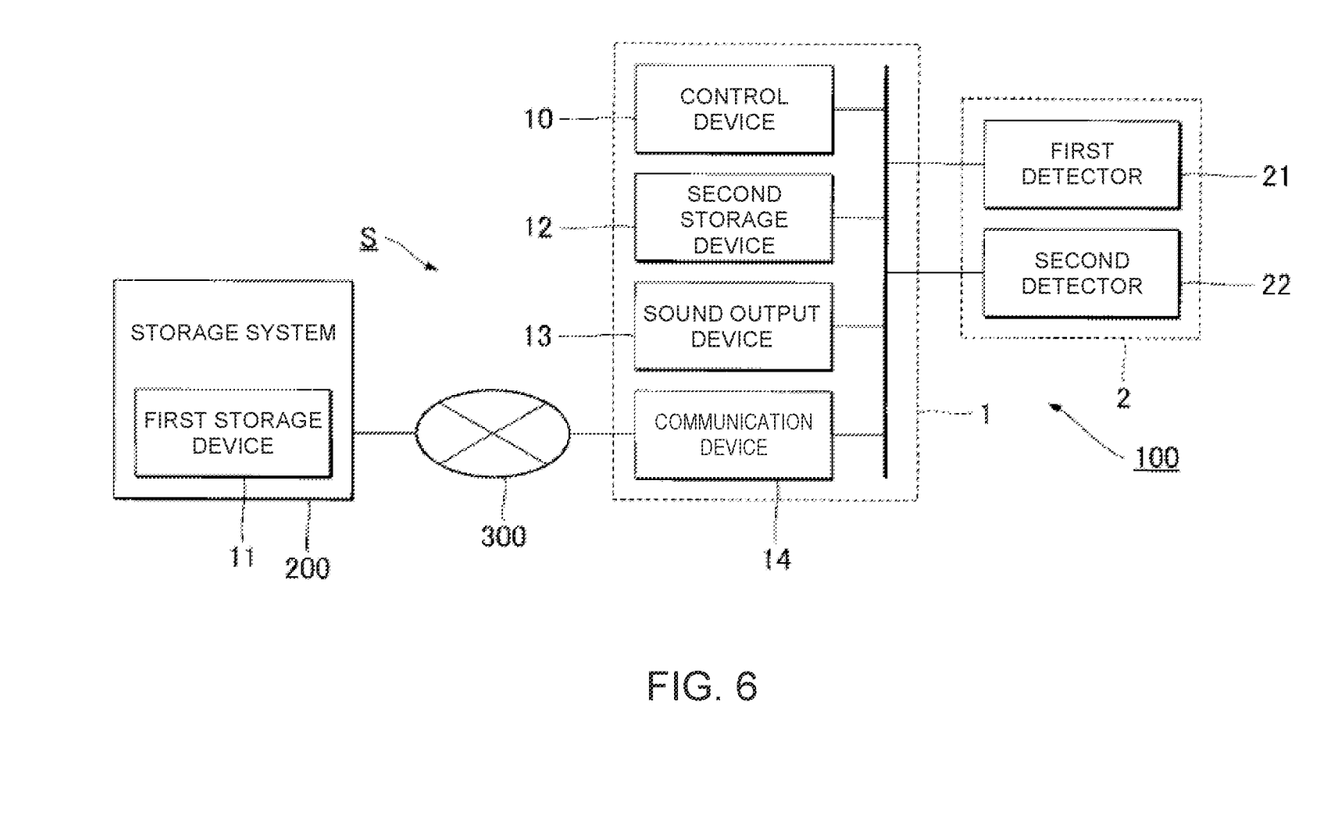
FIG. 6 is a block diagram illustrating the configuration of a communication system according to a third embodiment.

FIG. 6 is a block diagram illustrating the configuration of a communication system S according to a third embodiment. The communication system S is a server-client system including the information processing system 100 and a storage system 200. The information processing system 100 and the storage system 200 can communicate with each other via a communication network 300, such as the Internet.

The information processing system 100 has a configuration in which the first storage device 11 in the first embodiment is replaced with a communication device 14. The communication device 14 communicates with the storage system 200 via the communication network 300. The term "communication device" as used herein includes a receiver, a transmitter, and/or a transmitter-receiver, and contemplates any device or devices, separate or combined, capable of transmitting and/or receiving communication signals. The storage system 200 is a server system including the first storage device 11 in which is stored control data C.

Figure 7:
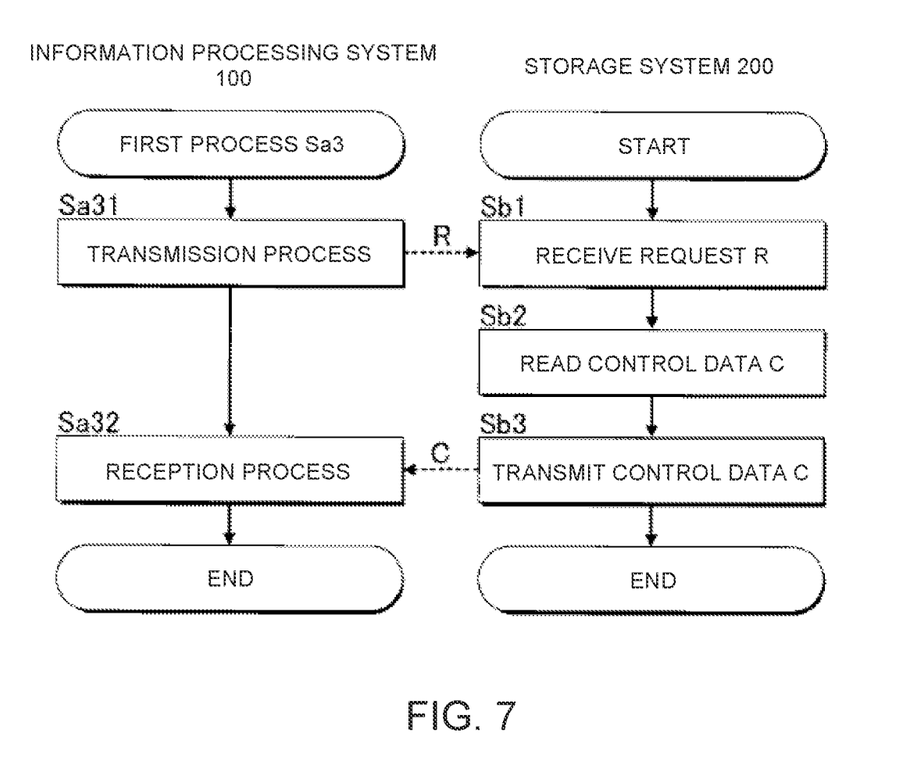
FIG. 7 is a flowchart illustrating the specific procedure of a first process in the third embodiment.

FIG. 7 is a flowchart illustrating a specific procedure of a first process (Sa3) of the control process Sa in the third embodiment. When the first process is started, the electronic controller 10 (first processing module 31) executes a transmission process (Sa31). The transmission process is a process for transmitting a request R for the control data C from the communication device 14 to the storage system 200 (first storage device 11) via the communication network 300.

When the request R is received from the information processing system 100 (Sb1), the storage system 200 reads the control data C stored in the first storage device 11 (Sb2). The storage system 200 transmits the control data C to the information processing system 100, which is the source of the request (Sb3).

The electronic controller 10 (first processing module 31) of the information processing system 100 executes a reception process (Sa32). The reception process is a process for receiving control data C transmitted from the storage system 200 by the communication device 14 and storing the control data C in the second storage device 12. As can be understood from the foregoing explanation, the first process in the third embodiment includes the transmission process (Sa31) and the reception process (Sa32). In the second embodiment, if the user's hand H is detected to be in the first state, the control data C stored in the first storage device 11 are loaded into the second storage device 12, in the same manner as in the first embodiment.

The same effects as those of the first embodiment are realized in the third embodiment. Further, in the third embodiment, since the control data C are stored in the first storage device 11 of the storage system 200, there is no need that the first storage device 11 be kept in the information processing system 100. Therefore, there is the advantage that the storage capacity required for the information processing system 100 can be reduced.

In a configuration in which the information processing system 100 receives the control data C from the first storage device 11 via the communication network 300, as in the third embodiment, there are cases in which the time required by the first process can become lengthy due, for example, to a delay in communication in the communication network 300. Therefore, in the comparative example in which the first process is initiated at the time point t2 when the hand H strikes the operation surface F, if the information processing system 100 acquires the control data C via the communication network 300, the delay in the generation of the target sound becomes particularly pronounced. In consideration of the circumstances described above, a configuration in which the first process is executed at the time point t1 when the first state is detected for the purpose of reducing the delay in the target sound is exceptionally effective in a configuration in which the control data C are sent and received via the communication network 300, as in the third embodiment.

In the description above, embodiments based on the first embodiment are used as an example, but the same configuration as that of the third embodiment can be applied to the second embodiment in which N pieces of the control data C are loaded into the second storage device 12. That is, the first processing module 31 receives N pieces of the control data C from among the M pieces of the control data C stored in the first storage device 11 from the storage system 200 via the communication network 300, and stores the N pieces of the control data C in the second storage device 12.

D: Modification

Specific modified embodiments to be added to each of the aforementioned embodiment examples are illustrated below. Two or more embodiments arbitrarily selected from the following examples can be appropriately combined insofar as they are not mutually contradictory.

(1) In the embodiments described above, the case in which the first detector 21 is a distance measurement sensor is used as an example, but the type of the first detector 21 is not limited to the example described above. For example, an image sensor that captures an image of the user's hand H can be used as the first detector 21. In this case, the state detection module 30 analyzes the image of the hand H captured by the first detector 21 in order to calculate the distance D and detects the first state in accordance with the distance D. Further, an infrared sensor that emits and receives infrared light can be used as the first detector 21. In this case, the state detection module 30 calculates the distance D from the intensity of the received infrared radiation reflected from the surface of the hand H. Further, the position in which the first detector 21 is installed is arbitrary. For example, the first detector 21 can capture an image of the hand H from the side.

(2) In the aforementioned embodiments, the detection signal Q2 that represents sounds that include striking sounds is analyzed to detect the second state, but the configuration and method of detecting the contact of the hand H with the operation surface F is not limited to the example described above. For example, the detection signal Q1 generated by the first detector 21 can be analyzed to detect contact of the hand H with the operation surface F (that is, the second state). For example, the state detection module 30 determines that the user's hand H is in the second state when the distance D identified from the detection signal Q1 reaches zero. The second detector 22 is omitted in a configuration in which the detection signal Q1 is used for the detection of the second state. Further, a contact sensor (for example, an electrostatic capacitive sensor) that detects contact of the hand H with the operation surface F (light transmission portion 20b), a vibration sensor that detects the vibration of operation surface F (light transmission portion 20b), or a pressure sensor that detects pressure from the hand H that acts on the operation surface F can be used as the second detector 22.

(3) In the aforementioned embodiments, a configuration in which the user's hand H comes in contact with the operation surface F is used, but the object coming in contact with the operation surface F is not limited to the hand H. For example, the user can strike the operation surface F with a striking member such as a stick for a percussion instrument. As can be understood from the examples described above, objects coming in contact with the operation surface F include both a part of the user's body (typically, hand H) and a striking member operated by the user. In a configuration in which a striking member strikes the operation surface F, the first detector 21 or the second detector 22 can be mounted on the striking member.

(4) The configuration of the housing 20 of the detection unit 2 is arbitrary. Further, the structure in which first detector 21 and the second detector 22 are housed in the housing 20 is not mandatory. In other words, as long as the detection unit 2 includes the operation surface F with which an object such as the user's hand H comes in contact, the specific structure and presence/absence of the housing 20 are not particularly limited.

(5) In the aforementioned embodiments, the information processing system 100 equipped with one detection unit 2 is illustrated. In another example, the information processing system 100 can be equipped with a plurality of the detection units 2, respectively corresponding to a plurality of different pitches. In this case, the state detection module 30 detects the first state or the second state for each of the plurality of detection units 2. The first processing module 31 loads into the second storage device 12 one or more pieces of the control data C of pitches that correspond to the detection unit 2 in which the first state is detected, from among the plurality of pieces of the control data C respectively corresponding to the plurality of different pitches, and the second processing module 32 executes the second process with respect to the control data C of a pitch corresponding to the detection unit 2 in which the second state is detected.

(6) In the aforementioned embodiments, the second process is executed with respect to the control data C representing sound waveforms to generate the audio signal X, but the contents of the control data C and the second process are not limited to the example described above. For example, in a configuration that uses control data C that represent the conditions of the sounds of speech (phonemes, pitch, etc.), a speech synthesis process for generating an audio signal X representing the sounds of speech is executed as the second process. Further, for example, in a configuration that uses control data C generated in a compression process for the audio signal X, a decoding process that generates the audio signal X from the control data C is executed as the second process.

(7) In the third embodiment in which the first storage device 11 is installed in the storage system 200, part of the second process can be executed by the storage system 200. In this case, the control data C, which has been subjected to part of the second process, are stored in the second storage device 12 of the information processing system 100. The second processing module 32 of the information processing system 100 executes the remaining part of the second process with respect to the control data C stored in the second storage device 12.

(8) In the aforementioned embodiments, a configuration in which the user's hand H actually comes in contact with the operation surface F is used as an example, but a configuration can be adopted in which the user touches a virtual operation surface F using haptic technology (haptics) that employs tactile feedback, for example. In this case, the user operates a simulated hand that exists in virtual space to contact the operation surface F installed in the virtual space. By using a vibrating body that vibrates when the operation surface F in virtual space is touched, the user perceives that he or she is actually in contact with the operation surface F. As can be understood from the foregoing explanation, the operation surface F can be a virtual surface in virtual space. Similarly, the object (e.g., hand H) that comes in contact with the operation surface F can be a virtual object in virtual space.

(9) As described above, the functions of the reproduction control system 100 (particularly the function of the control system 1) used by way of example above are realized by cooperation between one or a plurality of processors that constitute the electronic controller 10 and a program stored in the second storage device 12. The program according to the present disclosure can be provided in a form stored in a computer-readable storage medium and installed in a computer. For example, the storage medium can be a non-transitory storage medium, a good example of which is an optical storage medium (optical disc) such as a CD-ROM, but can include storage media of any known form, such as a semiconductor storage medium or a magnetic storage medium. Non-transitory storage media include any storage medium that excludes transitory propagating signals and does not exclude volatile storage media. Further, in a configuration in which a distribution device distributes the program via the communication network 300, a storage device that stores the program in the distribution device corresponds to the non-transitory storage medium.

E: Additional Statement

For example, the following configurations can be understood from the foregoing embodiment examples.

An information processing method according to one aspect (Aspect 1) of the present disclosure is executed by a computer, and comprises detecting a first state in which an object is separated from an operation surface by a prescribed distance, detecting a second state in which the object comes into contact with the operation surface after the first state is detected, executing a first process which includes reading data from a first storage device and loading the read data into a second storage device when the first state is detected, and executing a second process with respect to the data loaded into the second storage device when the second state is detected.

By the aspect described above, since data are loaded into the second storage device when an object is detected to be in the first state, the second process can be more quickly executed as compared with a configuration in which the first process and the second process are executed after the object is detected to be in the second state. Further, the first process and the second process are sequentially executed in a series of processes from the time that the object approaches the operation surface until the time of contact therewith. Therefore, the first process can be executed without the user being cognizant that the object is in the first state.

In a specific example (Aspect 2) of Aspect 1, the first process further includes transmitting a request for the data to the first storage device via a communication network, and receiving via the communication network the data transmitted from the first storage device in accordance with the request. In a configuration in which data are received from the first storage device via a communication network, the start of the second process is particularly prone to delay, due to communication delays in the communication network. Therefore, the configuration of the present disclosure in which the first process is executed when the object is detected to be in the first state is particularly suitable for a configuration in which data are received from the first storage device via the communication network.

In a specific example (Aspect 3) of Aspect 1 or 2, the second process includes generating a sound in accordance with the data loaded into the second storage device. By the aspect described above, delays in the sound generation can be reduced as compared with a configuration in which the first process and the second process are executed after the object is detected to be in the second state.

In a specific example (Aspect 4) of Aspect 3, the data include a plurality of pieces of data, and the second process includes generating a sound in accordance with any one of the plurality of pieces of data loaded into the second storage device. In a configuration in which a plurality of pieces of data are loaded into the second storage device, a longer time is required for the first process as compared with a configuration in which one piece of data is loaded into the second storage device. Therefore, the configuration of the present disclosure in which the first process is executed when the object is detected to be in the first state is particularly suitable.

A typical example of the plurality of pieces of data are data for generating different musical sounds, for example. That is, a plurality of pieces of data respectively generating a plurality of musical sounds are loaded into the second storage device before the transition to the second state. Then, for example, of the plurality of pieces of data loaded into the second storage device, data selected in accordance with the position of the object in the second state are used to generate the musical sounds.

An information processing system according to one aspect (Aspect 5) of the present disclosure comprises a state detection unit for detecting a first state in which an object is separated from an operation surface by a prescribed distance and detecting a second state in which the object comes into contact with the operation surface after the first state is detected, a first processing unit for executing a first process which includes reading data from a first storage device and loading the read data into a second storage device when the first state is detected, and a second processing unit for executing a second process with respect to the data loaded into the second storage device when the second state is detected.

A program according to one aspect (Aspect 6) of the present disclosure causes a computer to execute a process for detecting a first state in which an object is separated from an operation surface by a prescribed distance, detecting a second state in which the object comes into contact with the operation surface after the first state is detected, executing a first process which includes reading data from a first storage device and loading the read data into a second storage device when the first state is detected, and executing a second process with respect to the data loaded into the second storage device when the second state is detected.

The present disclosure can be applied to an information processing method, an information processing system, and a program. The information processing method us executed by the electronic controller 10 as a computer.

What is claimed is:

1. A sound processing method executed by a computer, the sound processing method comprising:
    detecting a first state in which an object is separated, by a prescribed distance, from an operation surface of a user operable inputter;
    detecting a second state in which the object comes in contact with the operation surface after the first state is detected;
    executing a first process which includes reading, from a first storage device, data that represent conditions of sounds of speech and loading, into a second storage device, the data that are read, in response to the detecting of the first state;
    executing a second process in which an audio signal that represents speech sounds in accordance with the conditions represented by the data loaded into the second storage device is synthesized and generated, in response to the detecting of the second state; and
    outputting the audio signal to a sound outputter that is different from the user operable inputter and outputs sound represented by the audio signal, the outputting of the audio signal being performed after the executing of the second process.

2. The sound processing method according to claim 1, wherein
    the executing of the first process further includes
        transmitting, to the first storage device via a communication network, a request for the data to be read, and
        receiving, via the communication network, the data read and transmitted from the first storage device in accordance with the request.

3. The sound processing method according to claim 1, wherein
    the data include a plurality of pieces of data, and
    the executing of the second process includes synthesizing and generating the audio signal that represents the speech sounds in accordance with any one of the plurality of pieces of data loaded into the second storage device.

4. The sound processing method according to claim 1, wherein
    each of the first state and the second state is detected by calculating a distance between the object and the operation surface.

5. A sound processing method executed by a computer, the sound processing method comprising:
    detecting a first state in which an object is separated, by a prescribed distance, from an operation surface of a user operable inputter;
    detecting a second state in which the object comes in contact with the operation surface after the first state is detected;
    executing a first process which includes reading, from a first storage device, data that are generated in a compression process for an audio signal, and loading, into a second storage device, the data that are read, in response to the detecting of the first state;
    executing a second process that includes a decoding process that generates the audio signal from the data loaded into the second storage device, in response to the detecting of the second state; and
    outputting the audio signal to a sound outputter that is different from the user operable inputter and outputs sound represented by the audio signal, the outputting of the audio signal being performed after the executing of the second process.

6. The sound processing method according to claim 5, wherein
    the executing of the first process further includes
        transmitting, to the first storage device via a communication network, a request for the data to be read, and receiving, via the communication network, the data read and transmitted from the first storage device in accordance with the request.

7. The sound processing method according to claim 5, wherein
the data include a plurality of pieces of data, and
the second process is executed in accordance with any one of the plurality of pieces of data loaded into the second storage device.

8. The sound processing method according to claim 5, wherein
each of the first state and the second state is detected by calculating a distance between the object and the operation surface.

9. A sound processing method executed by a computer, the sound processing method comprising:
detecting a first state in which an object is separated, by a prescribed distance, from an operation surface of a user operable inputter;
detecting a second state in which the object comes in contact with the operation surface after the first state is detected;
executing a first process which includes reading, from a first storage device, data that represent sound and loading, into a second storage device, the data that are read, in response to the detecting of the first state;
executing a second process in which an audio signal is generated, in response to the detecting of the second state, the audio signal being generated by
an effect imparting process in which an acoustic effect is imparted to the data loaded into the second storage device, or
a filtering process in which a frequency response of the sound which is represented by the data loaded into the second storage device is changed; and
outputting the audio signal to a sound outputter that is different from the user operable inputter and outputs sound represented by the audio signal, the outputting of the audio signal being performed after the executing of the second process.

10. The sound processing method according to claim 9, wherein
the executing of the first process further includes
transmitting, to the first storage device via a communication network, a request for the data to be read, and
receiving, via the communication network, the data read and transmitted from the first storage device in accordance with the request.

11. The sound processing method according to claim 9, wherein
the data include a plurality of pieces of data, and
the second process is executed in accordance with any one of the plurality of pieces of data loaded into the second storage device.

12. The sound processing method according to claim 9, wherein
each of the first state and the second state is detected by calculating a distance between the object and the operation surface.

* * * * *